(12) United States Patent
Drapkin et al.

(10) Patent No.: US 7,239,198 B1
(45) Date of Patent: Jul. 3, 2007

(54) SINGLE GATE OXIDE DIFFERENTIAL RECEIVER AND METHOD

(75) Inventors: Oleg Drapkin, North York (CA); Grigori Temkine, Toronto (CA)

(73) Assignee: ATI International SRL, Christchurch (BB)

( * ) Notice: Subject to any disclaimer, the term of this patent is extended or adjusted under 35 U.S.C. 154(b) by 0 days.

(21) Appl. No.: 09/211,469

(22) Filed: Dec. 14, 1998

(51) Int. Cl.
*G06G 7/12* (2006.01)

(52) U.S. Cl. .................. 327/563; 327/562; 327/58; 327/71

(58) Field of Classification Search .......... 327/563, 327/560, 561, 562, 88, 89, 96, 52, 58, 71, 327/72; 330/252, 260, 261
See application file for complete search history.

(56) References Cited

U.S. PATENT DOCUMENTS

| | | | |
|---|---|---|---|
| 4,994,756 A * | 2/1991 | Brilka | 330/260 |
| 5,122,680 A * | 6/1992 | Stakely et al. | 327/73 |
| 5,384,739 A * | 1/1995 | Keeth | 365/189.09 |
| 5,455,800 A * | 10/1995 | Wells et al. | 365/218 |
| 5,736,871 A * | 4/1998 | Goto | 326/115 |
| 6,008,698 A * | 12/1999 | Dacus et al. | 330/279 |
| 6,014,054 A * | 1/2000 | Kawakita et al. | 327/563 |
| 6,091,300 A * | 7/2000 | Setty et al. | 330/258 |
| 6,133,772 A * | 10/2000 | Drapkin et al. | 327/206 |

OTHER PUBLICATIONS

A.G.P. Design Guide: Covering 1X, 2X, and 4X Modes and 1.5 Volt and 3.3 Volt Signaling (Revision 1.0, Intel Corporation, Aug. 1998).
Accelerated Graphics Port Interface Specification (Revision 2.0, Intel Corporation, May 4, 1998).

* cited by examiner

*Primary Examiner*—Timothy P. Callahan
*Assistant Examiner*—An T. Luu
(74) *Attorney, Agent, or Firm*—Vedder, Price, Kaufman & Kammholz, P.C.

(57) ABSTRACT

An integrated differential receiver includes a single gate oxide differential receiver and an associated switchable voltage supply circuit. The integrated differential receiver determines the desired receiver supply voltage and selects a supply voltage for the single gate oxide differential receiver. When a lower supply voltage is determined as the desired supply voltage, the integrated differential receiver automatically provides a supply voltage to the single gate oxide differential receiver with a voltage higher than the I/O pad supply voltage and higher than the maximum input signal voltage to increase the speed of operation for the differential receiver. The switchable voltage supply circuit is operatively responsive to a control signal which indicates the desired supply voltage for the I/O pad. In one embodiment, both the single gate oxide differential receiver and the switchable voltage supply circuit are single gate oxide circuits.

17 Claims, 4 Drawing Sheets

SINGLE GATE OXIDE DIFFERENTIAL RECEIVER AND METHOD

RELATED CO-PENDING APPLICATIONS

This is a related application to the following co-pending applications, filed on even date, having the same inventors and assigned to instant assignee:

1. Differential Input Receiver and Method for Reducing Noise, U.S. Pat. No. 6,133,772, issued Oct. 17, 2000,
2. Voltage Supply Discriminator and Method, U.S. Pat. No. 6,297,683, issued Oct. 2, 2001; and
3. Pre-buffer Voltage Level Shifting Circuit and Method, having Ser. No. 09/211,496.

FIELD OF THE INVENTION

The invention relates generally to integrated circuit signal receivers and more particularly to differential receivers.

BACKGROUND OF THE INVENTION

Graphics controller chips, like many integrated circuit devices, utilize CMOS, logic cores, and associated input/output (I/O) pads as part of their circuit makeup. I/O pads include, for example, input/output buffers coupled to a common pad or pin. There is a constant challenge to continuously design smaller, faster and more complicated integrated circuits to provide increased functionality for multimedia applications and other applications. Typically, the logic core operates at a different supply voltage than the I/O pads. For example, with logic cores having gate lengths of 0.25 um, a core logic supply voltage may be 2.5 volts. Corresponding supply voltages for the input/output pads, however, may be different supply voltages such as 3.3 volts. However, future generation chips require faster speeds and lower power consumption, hence, lower supply voltages so that the I/O pads can switch at faster frequencies.

Also, integrated circuits must often provide compatibility with older versions of interface circuits. As a result, an integrated circuit may require that the I/O pads operate at either a 3.3 volt level, or for example, at a lower 1.5 volt level. The gate length and gate oxide thickness of I/O pad transistors must also typically be decreased to provide faster circuits that draw less current. With multilevel supply voltages, multi-gate oxide devices are often used to provide the requisite logic levels and overvoltage protection. However, a problem arises when multi-gate oxide transistors are used on the same chip. Using differing gate oxide thickness' requires additional fabrication processes and, hence, results in higher fabrication costs. Moreover, the larger gate oxide thickness' can slow the device down unnecessarily. For low voltage CMOS signaling, the input/output pad must also be designed to prevent static leakage and prevent damage due to gate-source or gate-drain overvoltage.

FIG. 1 shows a block diagram of a conventional I/O pad 10 including an output buffer 12 and an input buffer 14 coupled to a common pad or pin 16. The I/O pad 10 communicates signals to and from the pad 16 for the core logic 18. Some integrated circuit interfaces such as interfaces that interface a graphics controller chip with other processing chips (e.g. AGPX and AGP2X) for example are required to work with a 3.3 volt I/O voltage supply as well as with a 1.5 voltage supply. At the same time, the core voltage supply for 0.25 micron technology is 2.5 volts. This typically means that the input signal received by the interface chip can have a 0 volt to 1.5 volt swing for one application and 0 volt to 3.3 volt swing for another application. Where thick gate oxide MOS transistors are used for 3.3 volt I/O voltage supplies, they are typically unsuitable for 1.5 voltage supply based circuits because they cannot provide the required timing parameters since they may be too slow at the 1.5 voltage supply. In addition, thin gate oxide MOS transistors cannot typically withstand the 3.3 volt supply for a 3.3 volt input signal environment since a gate-source or gate-drain junction may have a 3.3V potential during normal operation. This may be higher than the normal maximum operating voltage for the device. It has been recommended to use a differential input stage to meet timing parameters and to make these parameters less dependent on temperature and less susceptible to noise.

A common solution to accommodate multiple differing supply voltages for a receiver stage for an I/O pad or other circuit for example has been to make two different integrated circuit chips—one for the 3.3 volt supply and another chip for a 1.5 volt supply. Typically, single (or thin gate) gate oxide differential receivers are designed for 1.5 volt supplies and for 1.5 volt input signals and are on a separate integrated circuit from thick gate oxide differential receivers. Thick gate oxide differential receivers are used to accommodate the 3.3 volt voltage supply for a 3.3 input signal. As such, there are typically two different designs on two different integrated circuit chips.

Consequently, there exists a need for a differential receiver and circuitry that accommodates a varying voltage supply that automatically accommodates different supply voltages and input signal levels on a single integrated circuit chip. Moreover, it would be desirable if such a differential receiver was able to automatically switch supply voltages and be designed as a single gate oxide circuit.

DETAILED DESCRIPTION OF A PREFERRED EMBODIMENT OF THE INVENTION

Briefly, an integrated differential receiver includes a single gate oxide differential receiver and an associated switchable voltage supply circuit. The integrated differential receiver determines the desired receiver supply voltage and selects a supply voltage for the single gate oxide differential receiver. When a lower supply voltage is determined as the desired supply voltage, the integrated differential receiver automatically provides a supply voltage to the single gate oxide differential receiver with a voltage higher than the I/O pad supply voltage and higher than the maximum input signal voltage to increase the speed of operation for the differential receiver. The switchable voltage supply circuit is operatively responsive to a control signal which indicates the desired supply voltage for the I/O pad. In one embodiment, both the single gate oxide differential receiver and the switchable voltage supply circuit are single gate oxide circuits.

In an alternative embodiment, the switchable voltage supply circuit is a thick gate oxide based circuit and is used to selectively supply a supply voltage to the single gate oxide differential receiver. In both embodiments, a supply voltage to the differential receiver is selected to be different from an I/O pad supply voltage when the desired I/O pad supply voltage is below a predetermined threshold or reference voltage.

Figure 1:
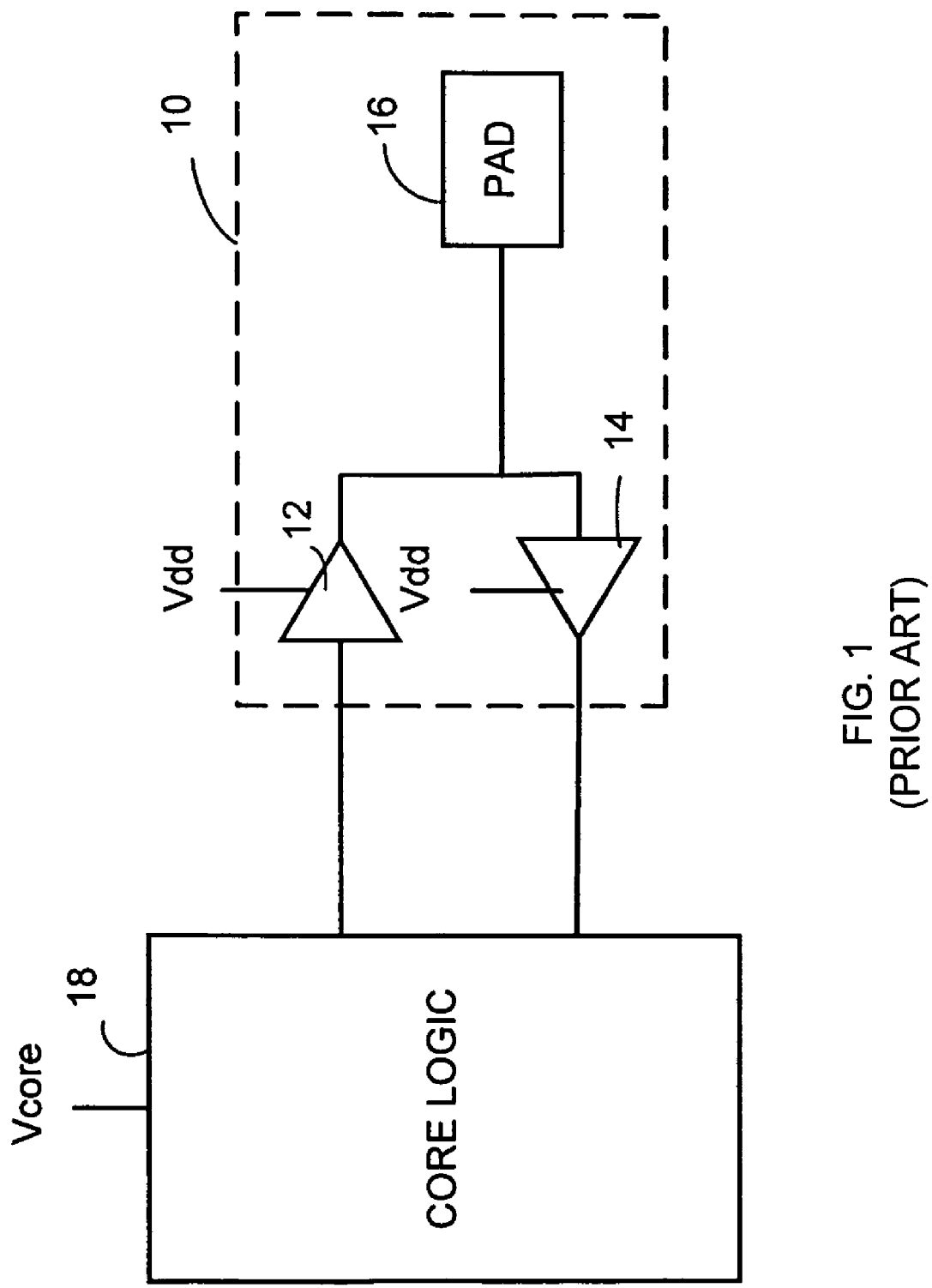
FIG. 1 is a block diagram illustrating a prior art integrated circuit with core logic and an I/O pad having an input buffer (receiver), and an output buffer.
Figure 2:
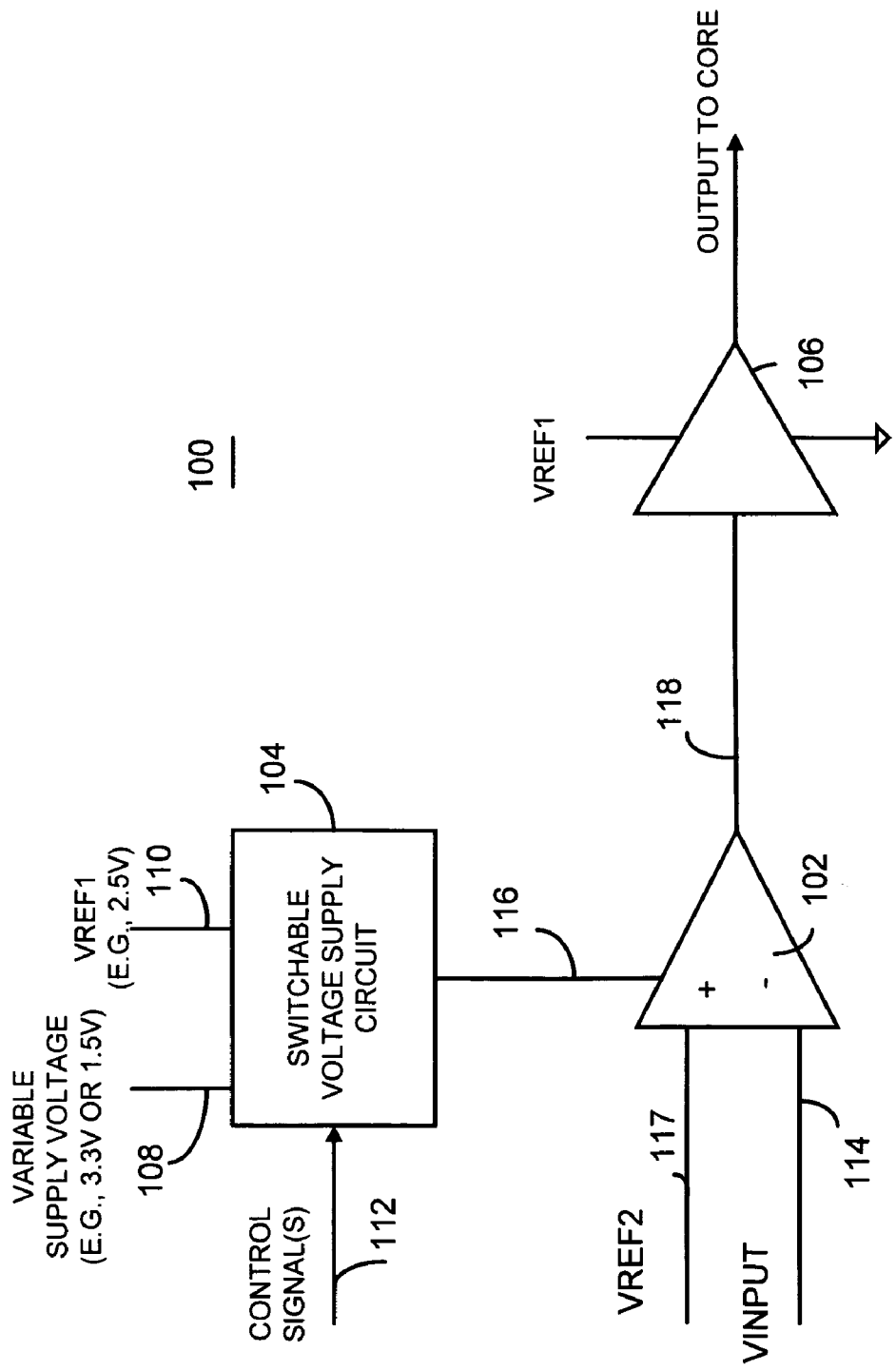
FIG. 2 is a block diagram illustrating one embodiment of an integrated differential receiver in accordance with one embodiment of the invention.

FIG. 2 illustrates one embodiment of an integrated differential receiver 100 having a single gate oxide differential receiver 102, a switchable voltage supply circuit 104 and an isolation output buffer 106. The switchable voltage supply circuit 104 receives as input, a desired I/O pad supply voltage 108 which may be a plurality of different supply voltages. For purposes of illustration only, the desired supply voltages may be, for example, 3.3 volts and 1.5 volts. The switchable voltage supply circuit 104 also receives another input such as a reference supply voltage 110 which may be for example the supply voltage for the core logic, such as 2.5 volts or other suitable reference voltage. In addition, the switchable voltage supply circuit 104 receives a control signal 112 which indicates an input signal voltage range, such as whether the input signal 114 to the differential receiver 102 will be in a range from 0 to 1.5 volts, or for example 0 to 3.3 volts. The control signal may be a signal from an input pin for the integrated circuit or may come from other suitable control logic on the integrated circuit. The switchable voltage supply circuit 104 selects a single gate oxide differential receiver supply voltage 116 for the single gate oxide differential receiver 102 based on the desired I/O pad supply voltage 108, the first reference voltage 110 and the control signal 112.

The differential receiver 102 receives the input signal 114, for example, from an external chip. The input signal is received on one input of the single gate oxide differential receiver 102. On another input, the single gate oxide differential receiver 102 receives a reference voltage 117. The reference voltage 117 may be for example one half of the desired supply voltage 108, or any other suitable reference voltage. Based on the reference voltage 117 and the level of the input signal 114, the differential receiver outputs a received signal 118 to the isolation output buffer 106. The isolation output buffer 106 then outputs the signal 118 to the core logic.

In operation, the circuit provides either of at least an I/O pad supply voltage 108 and a reference supply voltage 110 for the single gate oxide differential receiver based on the control signal such that the reference supply voltage 110 is selected as the differential receiver supply voltage 116 when the control signal indicates a maximum input signal voltage to be less than the reference supply voltage 110. The circuit also provides the I/O pad supply voltage as the differential receiver supply voltage 116 when the control signal indicates a maximum input signal voltage to be greater than the reference supply voltage 110.

Accordingly, the switchable voltage supply circuit determines a desired I/O pad supply voltage and the input voltage range and generates a single gate oxide receiver supply voltage to maximize the speed of operation of the differential receiver 102. For example, if the desired supply voltage 108 is set at 3.3 volts, and the control signal 112 indicates that the input signal range is 0 to 3.3 volts, the switchable voltage supply circuit 104 will generate a 3.3 volt supply for the single gate oxide differential receiver 102. It will be recognized that the supply voltage to the single gate oxide differential receiver 102 may not be exactly 3.3 volts, or the indicated input signal level, but it may be different by an order of several junction thresholds depending upon the design of a switchable voltage supply circuit 104.

If however the desired I/O pad supply voltage is 1.5 volts as indicated by the I/O pad voltage 108, and if the control signal 112 indicates that the input voltage range is 0 to 1.5 volts, the switchable voltage supply circuit 104 selects a supply voltage 116 for the single gate oxide differential receiver that is different from the 1.5 volt I/O pad supply or input signal range. For example if the I/O pad 108 is indicated to be 1.5 volts by the control signal, the switchable voltage supply circuit 104 generates a 2.5 volt single gate oxide differential receiver supply voltage 116 for the differential receiver to maximize the speed of operation of the differential receiver 102. As such when a lower I/O pad supply voltage is used, the integrated differential receiver 100 automatically detects the level and outputs a higher supply voltage to the single gate oxide differential receiver. In one embodiment, the higher output voltage is equal to the first reference voltage 110.

Figure 3:
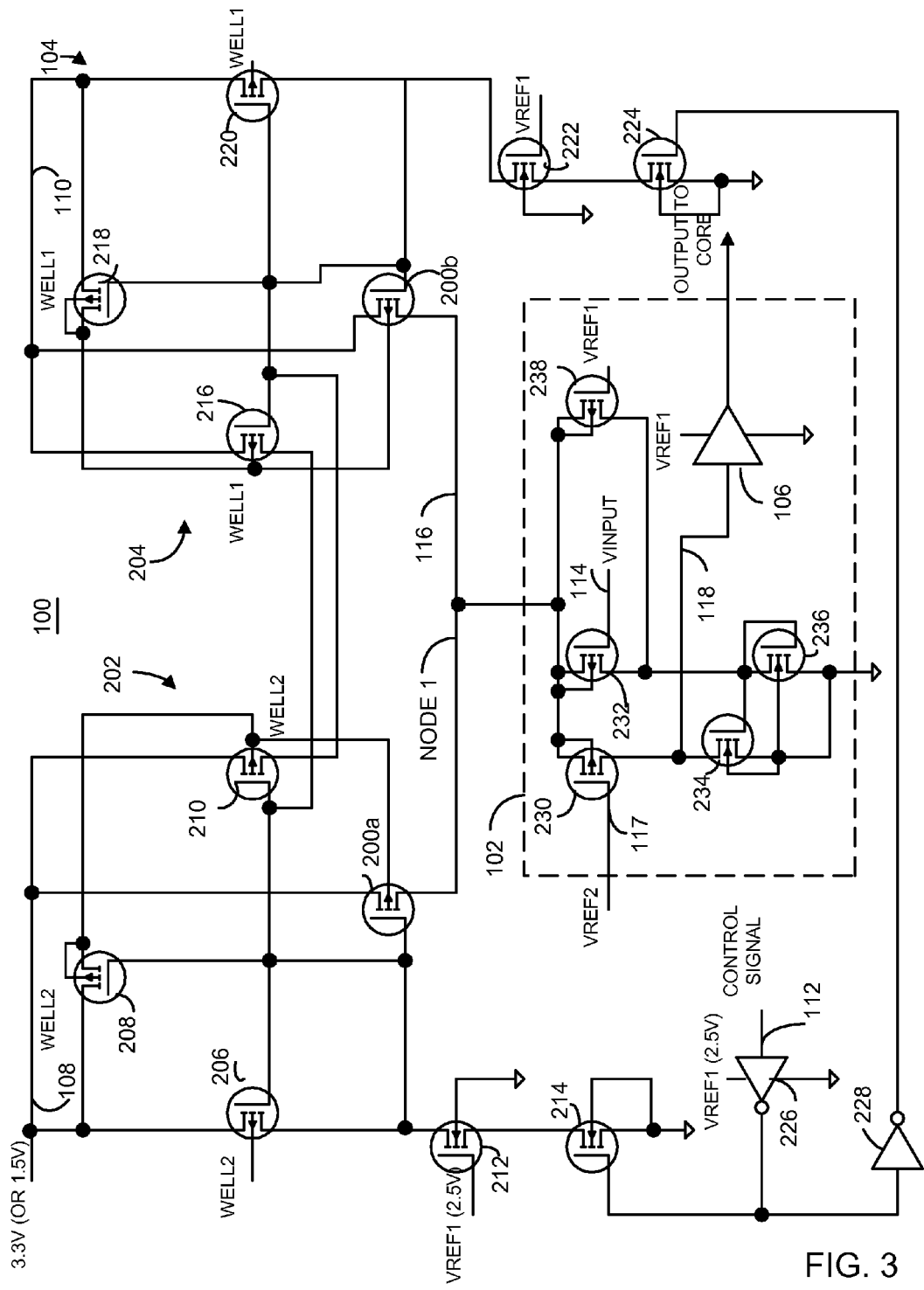
FIG. 3 is a circuit diagram illustrating one embodiment of an integrated differential receiver in accordance with the invention wherein a differential receiver and associated switchable voltage supply circuit are made from single gate oxide devices.

FIG. 3 shows a circuit diagram of one embodiment of the integrated differential receiver 100 wherein the switchable voltage supply circuit 104 is also based on single gate oxide devices such as nmos and pmos field effect transistors (FETS), or any other suitable devices. The switchable voltage supply circuit 104 includes a pair of current sources 200a and 200b wherein one current source is used to supply one level of supply voltage to the single gate oxide differential receiver 102 and the other current source is used to provide the requisite current (and hence voltage) for a second supply voltage for the single gate oxide differential receiver. The switchable voltage supply circuit 104 includes a first voltage switching circuit 202 and a second switching circuit 204. The first switching circuit 202 is switched in and provides a higher source voltage such as 3.3 volts, whereas the second switching circuit 204 switches in a supply voltage higher than the maximum input voltage. For example, when the maximum input voltage is 1.5 volts, the switching circuit 204 switches in a higher reference voltage, than the maximum input voltage, such as 2.5 volts, to supply the voltage for the single gate oxide differential receiver. As shown, all FET devices are thin gate oxide devices. In addition all of the FET devices for the single gate oxide differential receiver are also thin gate devices, such as silicon dioxide based FETs having a gate oxide thickness of approximately 50 angstroms.

The voltage switching circuit 202 includes a plurality of pmos transistors 206, 208 and 210, and a nmos transistors 212, and 214. Similarly, the second voltage supply circuit 204 includes pmos transistors 216, 218 and 220, and nmos transistors 222 and 224. A pair of inverters 226 and 228 are also used. The switchable voltage supply circuit 104 is a single gate oxide device in part because of nmos transistors 214 and 224. These devices serve as a type of voltage divider. The nmos transistor 214 is "on" and nmos transistor 224 is "off" when there is a 3.3V input signal since the control signal 112 is 0V. For a 1.5V condition, the control signal 112 is equal to 2.5V. Therefore, nmos transistor 214 is "off" and nmos transistor 224 is "on." When nmos transistor 214 is "on" and nmos transistor 224 is "off", switching circuit 202 is "on", sending current to node1 from the 3.3V voltage supply, and switching circuit 204 is "off".

When nmos transistor 214 is "off", and nmos transistor 224 is "on", switching circuit 204 is "on" sending current to node1 from the 2.5V supply, and switching circuit 202 is "off". In this case, the gate of nmos transistor 214 has a potential of 0 volts, but the drain of pmos transistor 206 might have a potential of 3.3V. Therefore, nmos transistor 212 prevents nmos transistor 214 from having its gate-drain voltage of 3.3V. The gate potential of nmos transistor 212 is 2.5V. This results in the potential of its source will not be larger than 2.5V-Vtn (when the switching circuit 202 is off). The nmos transistor 222 serves the same purpose when the switching circuit 204 is "off".

In operation, the inverter 226 receives the control signal 112 which, by way of example, may vary from 0 volts to 2.5 volts. In this example, the control signal is 0 volts, when a 3.3 volt I/O pad supply is used. The control signal is 2.5 volts when the I/O pad supply voltage is 1.5 volts. When the I/O pad supply voltage is 3.3 volts, the control signal, being 0 volts, becomes inverted through inverter 226 to a 2.5 volt level turning on nmos transistor 214. This in turn turns on transistor 212 which then activates the current source 200a to supply approximately 2.8 volts as a supply voltage for the single gate oxide differential receiver at node 1. The control signal having been once inverted through inverter 226 is again inverted through inverter 228. As such, the output of inverter 228 is in a logic low level thereby keeping transistors 224 off which in turn through transistor 222, keeps the current source 200b off. The transistors 212 and 222 provide a type of voltage divider to allow single gate oxide technology to be used for all transistor devices in the circuit since the gate to source and gate to drain voltages do not exceed maximum allowable voltage levels and thereby are not degraded due to overvoltage conditions when a I/O pad supply voltage is for example 3.3 volts.

Conversely, when the control signal 112 is in a logic high level, such as 2.5 volts, indicating that the I/O pad supply voltage is 1.5 volts or other level lower than a previous level, the inverted signal through inverter 226 shuts off transistor 214 and turns on transistor 224. This in turn shuts off the current source 200a and activates the current source 200b. With the current source 200b activated, a voltage level at node 1 of approximately 2.0 volts is supplied as the single gate oxide differential receiver supply voltage. The voltage switching circuits 202 and 204 operate to alternately activate the common current source to selectively provide the differential receiver supply voltage for the single gate oxide differential receiver. Transistors 206, 208 and 210 provide the potential of well2 equal to 3.3V when the switching circuit 202 is "on" as well as provide floating conditions for well1, and switch "off" transistors 216, 218 and 220. Transistors 216, 218 and 220 provide well1 with a potential equal to 2.5V when the switching circuit 204 is "on" as well as provide floating conditions for well2 and switching "off" transistors 206, 208 and 210.

The single gate oxide differential receiver 102 includes differential input pmos transistors 230 and 232 as well as nmos transistors 234 and 236. In addition, pmos transistor 238 has a gate coupled to the first reference voltage and a source coupled to the single gate oxide differential receiver supply voltage 116. A drain is coupled to the drain of pmos input transistor 232 that receives the input signal. In operation, the transistors 230–236 operate as a conventional differential receiver. However, the transistor 238 acts to effectively provide the drain voltage of transistor 236 at the level of Vtn when input transistor 232 is off. For example, if the input voltage range was 0 to 3.3 volts for I/O pad supply voltage of 3.3 volts, when the input signal is 3.3 volts, transistor 232 is turned off and transistor 238 pulls up the drain of transistor 236 to reduce noise and also prevents the gate to drain voltage of transistor 232 from experiencing a voltage condition that exceeds a normal operating voltage range since the drain does not reach 0 volt level during a 3.3 volt or higher input voltage range. As such, the disclosed circuit provides a single gate oxide solution to reduce fabrication costs while still providing a robust design over differing I/O pad supply voltage ranges and input signal input signal voltage ranges.

Figure 4:
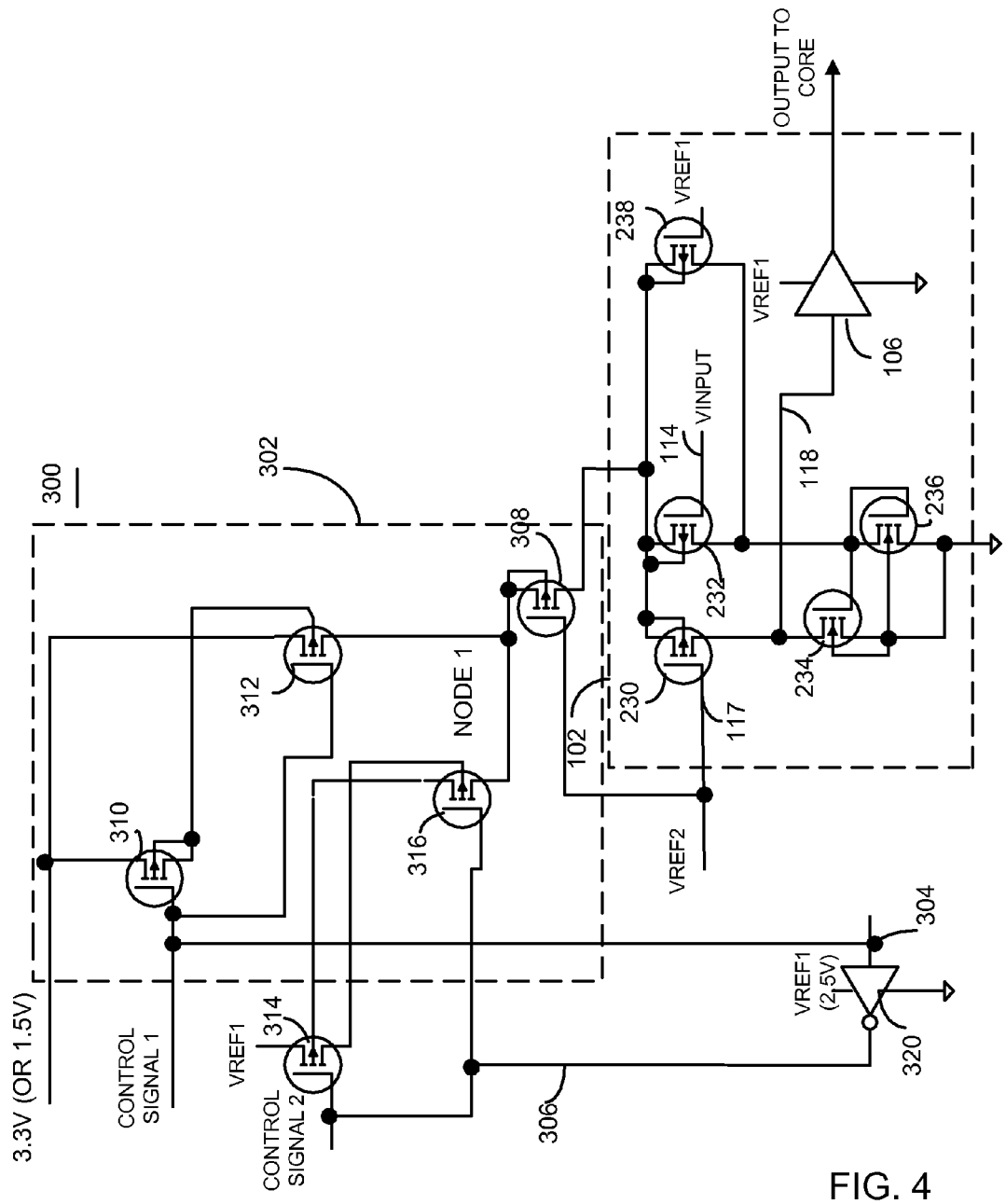
FIG. 4 is another embodiment of an integrated differential receiver in accordance with the invention wherein the differential receiver is a single gate oxide device and a switchable voltage supply circuit is a thick gate oxide based circuit.

FIG. 4 shows another embodiment of an integrated differential receiver 300 wherein the switchable voltage supply circuit 302 uses thick gate oxide transistors. Another difference is that a plurality of control signals 304 and 306 are used as opposed to a single control signal. The single gate differential receiver circuit 102 is identical to that previously described with reference to FIG. 3. The switchable voltage supply circuit 302 includes a current source 308 as well as two pairs of thick gate oxide pmos FET 310, 312, 314 and 316. The thick gate oxide devices may have for example a gate oxide thickness of approximately 70 angstroms. The pair of pmos FETs 310 and 312 act to supply the current source with a high supply voltage, such as 3.3 volts, when the I/O pad supply voltage is 3.3 volts. The pair of pmos transistors 314 and 316 serves to provide a current source when the I/O pad supply voltage is 1.5 volts (a lower supply voltage). In operation, when the control signal is at a logic low level, for example when the I/O pad supply voltage is the higher supply voltage such as 3.3 volts, the pmos transistors 310 and 312 are turned on. To provide 3.3V at node1, nmos transistor 308 works like a current source for the differential receiver. Its gate is biased with VREF2 (half of 3.3V or half of 1.5V).

When the input to transistors 310 and 312 is low, these transistors are on and the gates of transistors 314 and 316 are high through inverter 320. As such, they are effectively turned off and isolated. When the control signal is a logic high, such as 2.5 volts when the I/O pad supply voltage is a lower voltage such as 1.5 volts, the pair of transistors 310 and 312 are effectively shut off but the transistors 314 and 316 are turned on thereby pulling node 1 to approximately 2.5 volts.

It should be understood that the implementation of other variations and modifications of the invention in its various aspects will be apparent to those of ordinary skill in the art, and that the invention is not limited by the specific embodiments described. It is therefore contemplated to cover by the present invention, any and all modifications, variations, or equivalents that fall within the spirit and scope of the basic underlying principles disclosed and claimed herein.

What is claimed is:

1. An integrated differential receiver for an input/output pad comprising:
   a single gate oxide differential receiver that receives an input voltage;
   a switchable voltage supply circuit operatively coupled to the single gate oxide differential receiver, switchable through at least one control signal, that indicates an input signal voltage range, to select at least one differential receiver supply voltage, from a plurality of supply voltages during normal operating mode, for the single gate oxide differential receiver wherein at least one of the selected receiver supply voltages is higher than a maximum voltage level of the input voltage indicated by the control signal; and
   wherein the switchable voltage supply circuit is operatively responsive to at least two control signals.

2. The receiver of claim 1 wherein the switchable voltage supply circuit is coupled to the plurality of supply voltages that include at least an input/output pad supply voltage and a higher reference supply voltage and selects the differential receiver supply voltage that is higher voltage than the I/O pad supply voltage.

3. The receiver of claim 1 wherein the receiver generates an output signal to circuitry for a video graphics processor.

4. The receiver of claim 1 wherein the differential receiver receives a first reference voltage on a first differential input voltage on a second differential input and wherein the switchable voltage supply circuit selects the differential receiver supply voltage for the single gate oxide differential receiver to be a voltage level higher than the maximum voltage level of the input voltage.

5. The receiver of claim 1 including an isolation output buffer operatively coupled to an output of the differential receiver and that outputs a signal.

6. An integrated differential receiver for an input/output pad comprising:
  a single gate oxide differential receiver that receives a reference voltage on a first differential input and an input voltage on a second differential input;
  a switchable voltage supply circuit operatively coupled to the single gate oxide differential receiver, switchable through at least one control signal that indicates an input signal voltage range to select a differential receiver supply voltage, from a plurality of supply voltages during normal operating mode, for the single gate oxide differential receiver wherein at least one of the selected receiver supply voltages is a voltage level higher than a maximum voltage level of the input voltage;
  an isolation output buffer operatively coupled to an output of the differential receiver and to core logic; and
  wherein the switchable voltage supply circuit provides either of at least an I/O pad supply voltage or a reference supply voltage for the differential receiver based on the control signal such that the reference supply voltage is selected as the differential receiver supply voltage when the control signal indicates a maximum input signal voltage to be less than the reference supply voltage, and wherein the switchable voltage supply circuit provides the I/O pad supply voltage as the differential receiver supply voltage when the control signal indicates a maximum input signal voltage to be greater than the reference supply voltage.

7. The receiver of claim 6 wherein the switchable voltage supply circuit is operatively responsive to at least two control signals.

8. The receiver of claim 6 wherein the single gate oxide differential receiver includes the single gate oxide differential receiver includes a transistor, operatively coupled to an input transistor of a single gate differential input stage having a gate coupled to the reference voltage, a source coupled to the single gate oxide differential receiver supply voltage, and a drain coupled to a drain of the input transistor that receives the input signal.

9. A method for controlling a voltage supply for a differential receiver comprising the steps of:
  providing either of at least an I/O pad supply voltage or reference supply voltage for a single gate oxide differential receiver based on a control signal such that the reference supply voltage is selected as the differential receiver supply voltage, from a plurality of supply voltages during normal operating mode, when the control signal indicates a maximum input signal voltage to be less than the second reference voltage,
  providing the I/O pad supply voltage as the differential receiver supply voltage when the control signal indicates a maximum input signal voltage to be greater than the reference voltage; and
  providing at least one of an I/O pad supply voltage and a reference supply voltage for a differential receiver based on the control signal such that the reference supply voltage is selected as the differential receiver supply voltage when the control signal indicates a maximum input signal voltage to be less than the second reference voltage, and providing the I/O pad supply voltage as the differential receiver supply voltage when the control signal indicates a maximum input signal voltage to be greater than the reference supply voltage.

10. The method of claim 9 including the step of buffering an output signal from the single gate oxide differential receiver prior to core circuitry receiving the output signal.

11. The method of claim 9 including receiving a first reference voltage on a first differential input and an input voltage on a second differential input and selecting the differential receiver supply voltage for a single gate oxide differential receiver to be a voltage level higher than a maximum voltage level of the input voltage.

12. An integrated differential receiver for an input/output pad comprising:
  a single gate oxide differential receiver that receives an input voltage; and
  a switchable voltage supply circuit operatively coupled to the single gate oxide differential receiver,
  wherein the switchable voltage supply circuit provides either of at least an I/O pad supply voltage or a reference supply voltage for the differential receiver based on the control signal such that the reference supply voltage is selected as a differential receiver supply voltage when the control signal indicates a maximum input signal voltage to the single gate oxide differential receiver to be less than the reference supply voltage, and wherein the switchable voltage supply circuit provides I/O pad supply voltage as the differential receiver supply voltage when the control signal indicates a maximum input signal voltage to be greater than the reference supply voltage.

13. The receiver of claim 2 wherein the single gate oxide differential receiver includes a transistor having a gate, a source and a drain such that at least one of: the gate to the source and the gate to the drain cannot withstand the higher voltage than the I/O pad supply voltage.

14. An integrated differential receiver for an input/output pad comprising:
  a single gate oxide differential receiver that receives an input voltages;
  a switchable voltage supply circuit operatively coupled to the single gate oxide differential receiver, switchable through at least one control signal, that indicates an input signal voltage range, to select at least one differential receiver supply voltage, from a plurality of supply voltages during normal operating mode, for the single gate oxide differential receiver wherein at least one of the selected receiver supply voltages is higher than a maximum voltage level of the input voltage indicated by the control signal; and
  wherein the single gate oxide differential receiver includes a transistor operatively coupled to an input transistor of a single gate differential input stage having a gate coupled to a first reference voltage, a source coupled to the single gate oxide differential receiver supply voltage, a drain coupled to a drain of the input transistor that receives the input signal.

15. An integrated differential receiver for an input/output pad comprising:
   a single gate oxide differential receiver that receives an input voltage;
   a switchable voltage supply circuit operatively coupled to the single gate oxide differential receiver, switchable through at least one control signal, that indicates an input signal voltage range, to select at least one differential receiver supply voltage, from a plurality of supply voltages during normal operating mode, for the single gate oxide differential receiver wherein at least one of the selected receiver supply voltages is higher than a maximum voltage level of the input voltage indicated by the control signal; and
   wherein the switchable voltage supply circuit includes a plurality of voltage switching circuits operative to alternately activate a common current source to selectively provide the differential receiver supply voltage for the single gate oxide differential receiver.

16. An integrated differential receiver for an input/output pad comprising:
   a single gate oxide differential receiver that receives an input voltage;
   a switchable voltage supply circuit operatively coupled to the single gate oxide differential receiver, switchable through at least one control signal, that indicates an input signal voltage range, to select at least one differential receiver supply voltage, from a plurality of supply voltages during normal operating mode, for the single gate oxide differential receiver wherein at least one of the selected receiver supply voltages is higher than a maximum voltage level of the input voltage indicated by the control signal; and
   wherein the switchable voltage supply circuit provides either of at least an I/O pad supply voltage or a reference supply voltage for the differential receiver based on the control signal such that the references supply voltage is selected as the differential receiver supply voltage when the control signal indicates a maximum input signal voltage to the single gate oxide differential receiver to be less than the references supply voltage, and wherein the switchable voltage supply circuit provides the I/O pad supply voltage as the differential receiver supply voltage when the control signal indicates a maximum input signal voltage to be greater than the reference supply voltage.

17. An integrated differential receiver for an input/output pad comprising:
   a single gate oxide differential receiver that receives an input voltage;
   a switchable voltage supply circuit operatively coupled to the single gate oxide differential receiver, switchable through at least one control signal, that indicates an input signal voltages range, to select at least one differential receiver supply voltage, from a plurality of supply voltages during normal operating mode, for the single gate oxide differential receiver wherein at least one of the selected receiver supply voltages is higher than a maximum voltage level of the input voltage indicated by the control signal; and
   wherein the single gate oxide differential receiver includes an input transistor having a gate, a source and a drain wherein the gate receives an input voltage on a differential input and the drain is coupled to the differential receiver supply voltage such that when the input voltage is at a maximum input voltage, the input transistor is off.

* * * * *